(12) United States Patent
Shih et al.

(10) Patent No.: US 11,784,158 B2
(45) Date of Patent: Oct. 10, 2023

(54) PRODUCING APPARATUS

(71) Applicant: GALLANT MICRO. MACHINING CO., LTD., New Taipei (TW)

(72) Inventors: Tun-Chih Shih, New Taipei (TW); Liang-Yin Huang, New Taipei (TW); Ee-Sun Lim, New Taipei (TW)

(73) Assignee: GALLANT MICRO. MACHINING CO., LTD., New Taipei (TW)

( * ) Notice: Subject to any disclaimer, the term of this patent is extended or adjusted under 35 U.S.C. 154(b) by 157 days.

(21) Appl. No.: 17/209,358

(22) Filed: Mar. 23, 2021

(65) Prior Publication Data
US 2022/0122939 A1  Apr. 21, 2022

(30) Foreign Application Priority Data

Oct. 15, 2020 (TW) .................................. 109135700

(51) Int. Cl.
*H01L 23/00* (2006.01)
(52) U.S. Cl.
CPC ............ *H01L 24/75* (2013.01); *H01L 24/743* (2013.01); *H01L 2224/757* (2013.01); *H01L 2224/75901* (2013.01)
(58) Field of Classification Search
CPC ... H01L 24/75; H01L 24/743; H01L 2224/75; H01L 2224/757; H01L 2224/75901; H01L 2224/75701; H01L 2224/75702; H01L 2224/75001
See application file for complete search history.

(56) References Cited

U.S. PATENT DOCUMENTS

| | | | |
|---|---|---|---|
| 10,748,800 B2 | 8/2020 | Zhu et al. | |
| 2005/0204554 A1* | 9/2005 | Sillner | H01L 24/75 29/742 |
| 2019/0088516 A1* | 3/2019 | Zhu | H01L 21/67 |

FOREIGN PATENT DOCUMENTS

| | | | | |
|---|---|---|---|---|
| CN | 105225990 A | * | 1/2016 | ....... H01L 21/67132 |
| EP | 3312877 A2 | * | 4/2018 | ............ H01L 24/27 |
| JP | 3189331 B2 | * | 7/2001 | ............ H01L 24/75 |
| JP | 6276552 B2 | * | 2/2018 | ........... B05C 5/0208 |
| TW | I532109 B | | 5/2016 | |
| TW | I652745 B | | 3/2019 | |

* cited by examiner

*Primary Examiner* — George R Koch
(74) *Attorney, Agent, or Firm* — Li & Cai Intellectual Property (USA) Office (57) ABSTRACT

A producing apparatus and a pre-bonding device are provided. The pre-bonding device includes a dispensing mechanism and a die-placing mechanism that is arranged adjacent to the dispensing mechanism. The dispensing mechanism is configured to form a plurality of adhesives onto a plurality of carriers, respectively. The die-placing mechanism includes a plurality of catchers configured to respectively hold a plurality of chips and a correction unit that is configured to adjust a relative position of the chips. The catchers are configured to synchronously place the chips adjusted by the correction unit onto the adhesives, respectively.

12 Claims, 11 Drawing Sheets

PRODUCING APPARATUS

CROSS-REFERENCE TO RELATED PATENT APPLICATION

This application claims the benefit of priority to Taiwan Patent Application No. 109135700, filed on Oct. 15, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a producing apparatus, and more particularly to a producing apparatus and a pre-bonding device for effectively increasing a producing efficiency thereof.

BACKGROUND OF THE DISCLOSURE

A conventional producing apparatus includes a pre-bonding device and a die-bonding device that is located at a downstream position relative to the pre-bonding device. The pre-bonding device of the conventional producing apparatus is configured to place an adhesive and a chip onto any one of carriers one by one, and the die-bonding device of the conventional producing apparatus is configured to solidify the adhesives by heating and raising an environment temperature (e.g., through baking). However, the operation mechanism or producing efficiency of the conventional producing apparatus still has room for improvement.

SUMMARY OF THE DISCLOSURE

In response to the above-referenced technical inadequacies, the present disclosure provides a producing apparatus and a pre-bonding device to effectively improve on the issues associated with conventional producing apparatuses.

In one aspect, the present disclosure provides a pre-bonding device, which includes a dispensing mechanism and a die-placing mechanism. The dispensing mechanism is configured to form a plurality of adhesives onto a plurality of carriers, respectively. The die-placing mechanism is disposed adjacent to the dispensing mechanism. The die-placing mechanism includes a plurality of catchers configured to respectively hold a plurality of chips and a correction unit that is configured to adjust a relative position of the chips. The catchers are configured to synchronously place the chips adjusted by the correction unit onto the adhesives, respectively.

In another aspect, the present disclosure provides a producing apparatus, which includes a transporting device, a pre-bonding device, and a die-bonding device. The transporting device defines a predetermined path. The transporting device is configured to move an insulating film carrying a plurality of carriers along the predetermined path. The predetermined path has a pre-bonding region and a die-bonding region that is located at a downstream position relative to the pre-bonding region. The pre-bonding device is arranged corresponding to the pre-bonding region of the predetermined path, and includes a dispensing mechanism and a die-placing mechanism. The dispensing mechanism is configured to respectively form a plurality of adhesives onto the carriers that are moved through the pre-bonding region. The die-placing mechanism is disposed adjacent to the dispensing mechanism. The die-placing mechanism includes a plurality of catchers configured to respectively hold a plurality of chips and a correction unit that is configured to adjust a relative position of the chips. The catchers are configured to synchronously place the chips adjusted by the correction unit onto the adhesives that are moved through the pre-bonding region. The die-bonding device is arranged corresponding to the die-bonding region of the predetermined path. The die-bonding device is configured to press the chips moved through the pre-bonding region and is configured to solidify the adhesives moved through the pre-bonding region, so that any one of the chips is connected to the corresponding carrier through the corresponding adhesive.

Therefore, the producing apparatus or the die-bonding device of the present disclosure is provided for adjusting the relative position of the chips through the correction unit, so that the chips adjusted by the correction unit can be synchronously disposed on the adhesives, respectively, by the catchers. Accordingly, the operation or producing efficiency of the producing apparatus (or the pre-bonding device) can be effectively increased.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
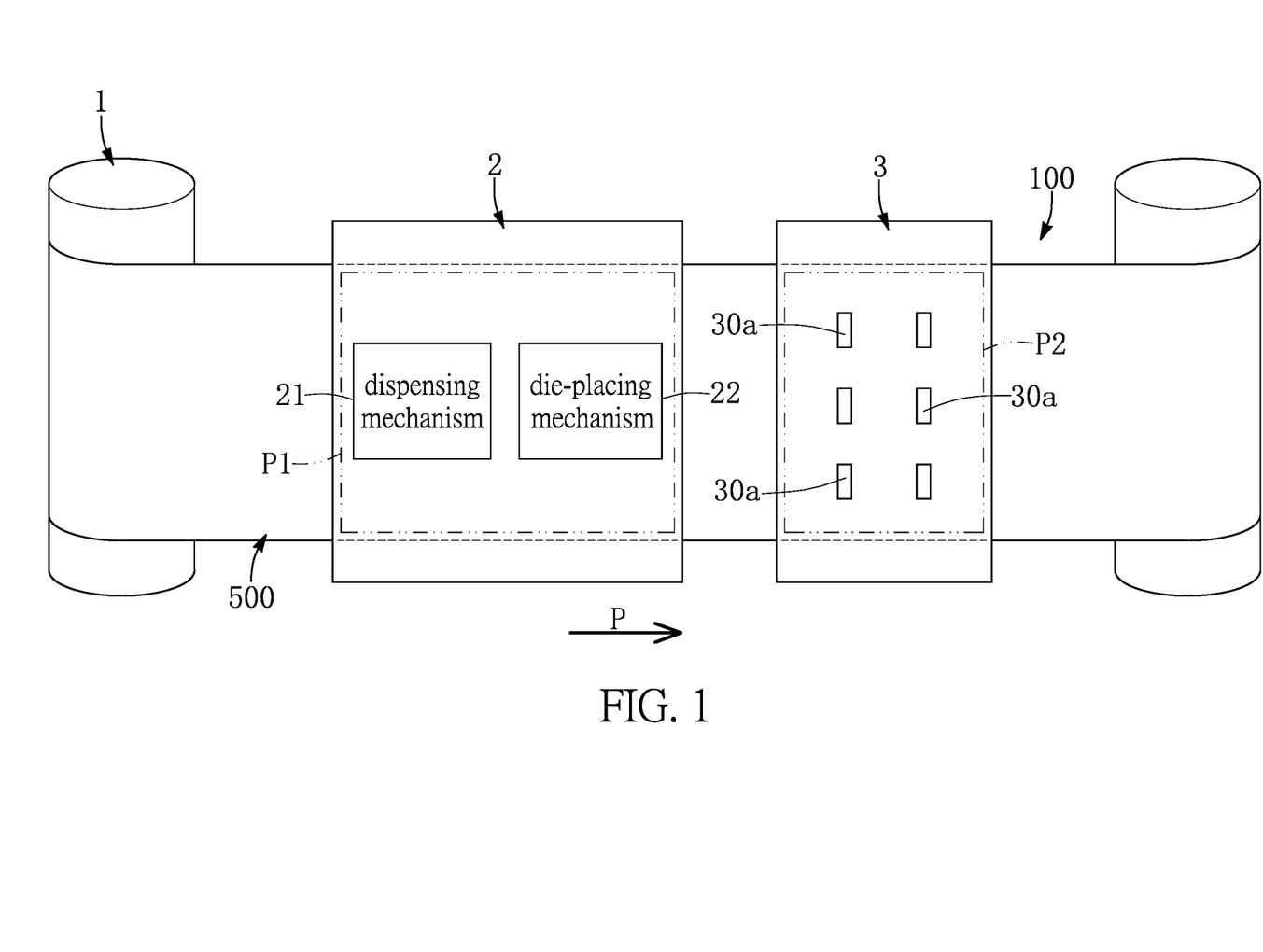
FIG. 1 is a schematic view of a producing apparatus according to a first embodiment of the present disclosure.
Figure 2:
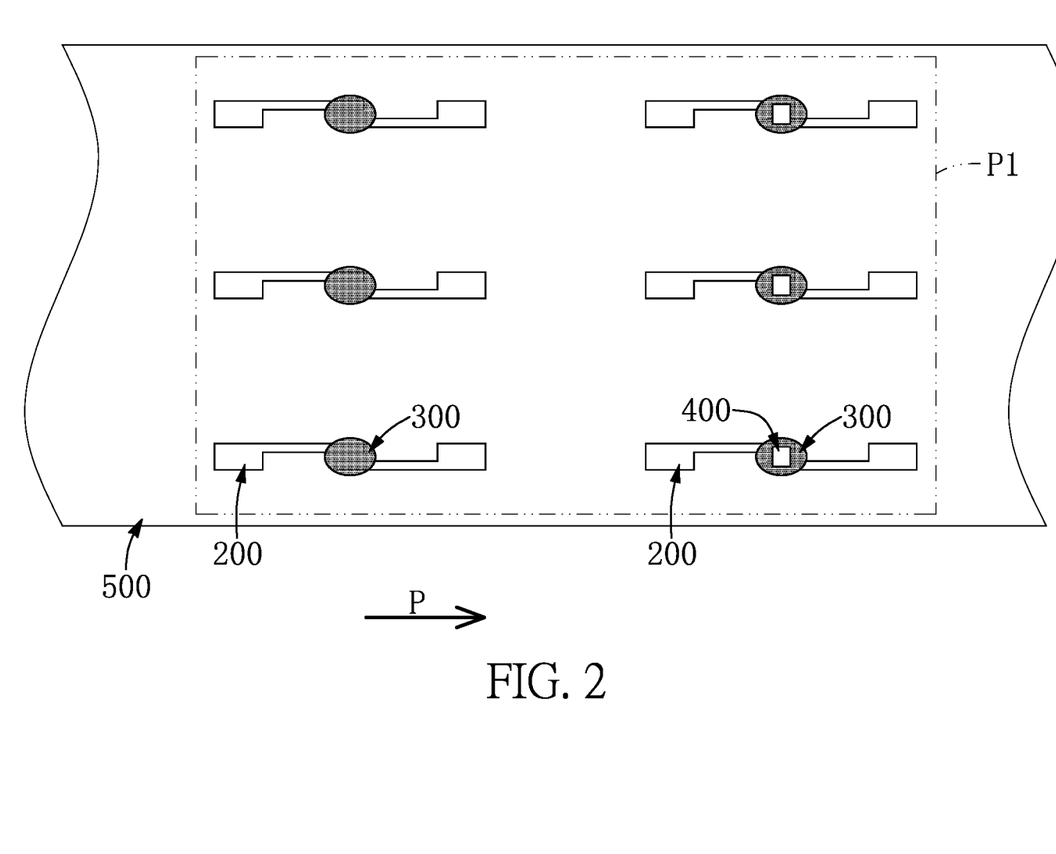
FIG. 2 is a schematic view of a pre-bonding region of the producing apparatus according to the first embodiment of the present disclosure.

Referring to FIG. 1 to FIG. 8, a first embodiment of the present disclosure provides a producing apparatus 100. As shown in FIG. 1 and FIG. 2, the producing apparatus 100 in the present embodiment is configured to make a plurality of carriers 200 to be respectively adhered to a plurality of chips 400 by a plurality of adhesives 300. In the present embodiment, the carrier 200 is an antenna (e.g., a radio frequency identification antenna), and the adhesive 300 is a conductive adhesive (e.g., an anisotropic conductive adhesive), but the present disclosure is not limited thereto. For example, in other embodiments of the present disclosure, the carrier 200 can be a board, and the adhesive 300 can be a non-conductive adhesive.

The producing apparatus 200 in the present embodiment includes a transporting device 1, a pre-bonding device 2 corresponding in position to the transporting device 1, and a die-bonding device 3 that is located at a downstream position relative to the pre-bonding device 2. The transporting device 1, the pre-bonding device 2, and the die-bonding device 3 in the present embodiment are described in cooperation with each other, but the present disclosure is not limited thereto. For example, in other embodiments of the present disclosure, the die-bonding device 3 (or the pre-bonding device 2) can be independently used (e.g., sold) or can be used in cooperation with other devices. For example, the pre-bonding device 2 of the present embodiment can be used in cooperation with a conventional die-bonding device, or the die-bonding device 3 of the present embodiment can be used in cooperation with a conventional pre-bonding device, but the present disclosure is not limited thereto.

The transporting device 1 in the present embodiment includes a plurality of rollers, but the present disclosure is not limited thereto. The transporting device 1 defines a predetermined path P, and the transporting device 1 is configured to move an insulating film 500 carrying the carriers 200 along the predetermined path P. That is to say, the transporting device 1 (e.g., the rollers) can drive the insulating film 500 to move along the predetermined path P. Moreover, the predetermined path P has a pre-bonding region P1 and a die-bonding region P2 that is located at a downstream position relative to the pre-bonding region P1. In other words, the carriers 200 can be moved from the pre-bonding region P1 to the die-bonding region P2 through the transporting device 1.

The pre-bonding device 2 is arranged corresponding to the pre-bonding region P1 of the predetermined path P. In other words, the pre-bonding device 2 can be operated toward a portion of the insulating film 500 arranged in the pre-bonding region P1 by being arranged corresponding to the pre-bonding region P1. The pre-bonding device 2 includes a dispensing mechanism 21 and a die-placing mechanism 22 that is disposed adjacent to the dispensing mechanism 21. The die-placing mechanism 22 is preferably located at a downstream position relative to the dispensing mechanism 21.

The dispensing mechanism 21 is configured to respectively form the adhesives 300 onto the carriers 200 that are moved through the pre-bonding region P1 (e.g., each of the carriers 200 is adhered to one of the adhesives 300). Specifically, the dispensing mechanism 21 can be configured to synchronously form the adhesives 300 onto the carriers 200, or the dispensing mechanism 21 can be configured to form the adhesives 300 onto the carriers 200 one by one, but the present disclosure is not limited thereto.

The die-placing mechanism 22 is configured to respectively place the chips 400 onto the adhesives 300 that are moved through the pre-bonding region P1 (e.g., each of the adhesives 300 is adhered to one of the chips 400). The die-placing mechanism 22 in the present embodiment is configured to synchronously place the chips 400 onto the adhesives 300, respectively, but the present disclosure is not limited thereto. In other embodiments of the present disclosure, the die-placing mechanism 22 can be configured to place the chips 400 onto the adhesives 300 one by one.

Figure 3:
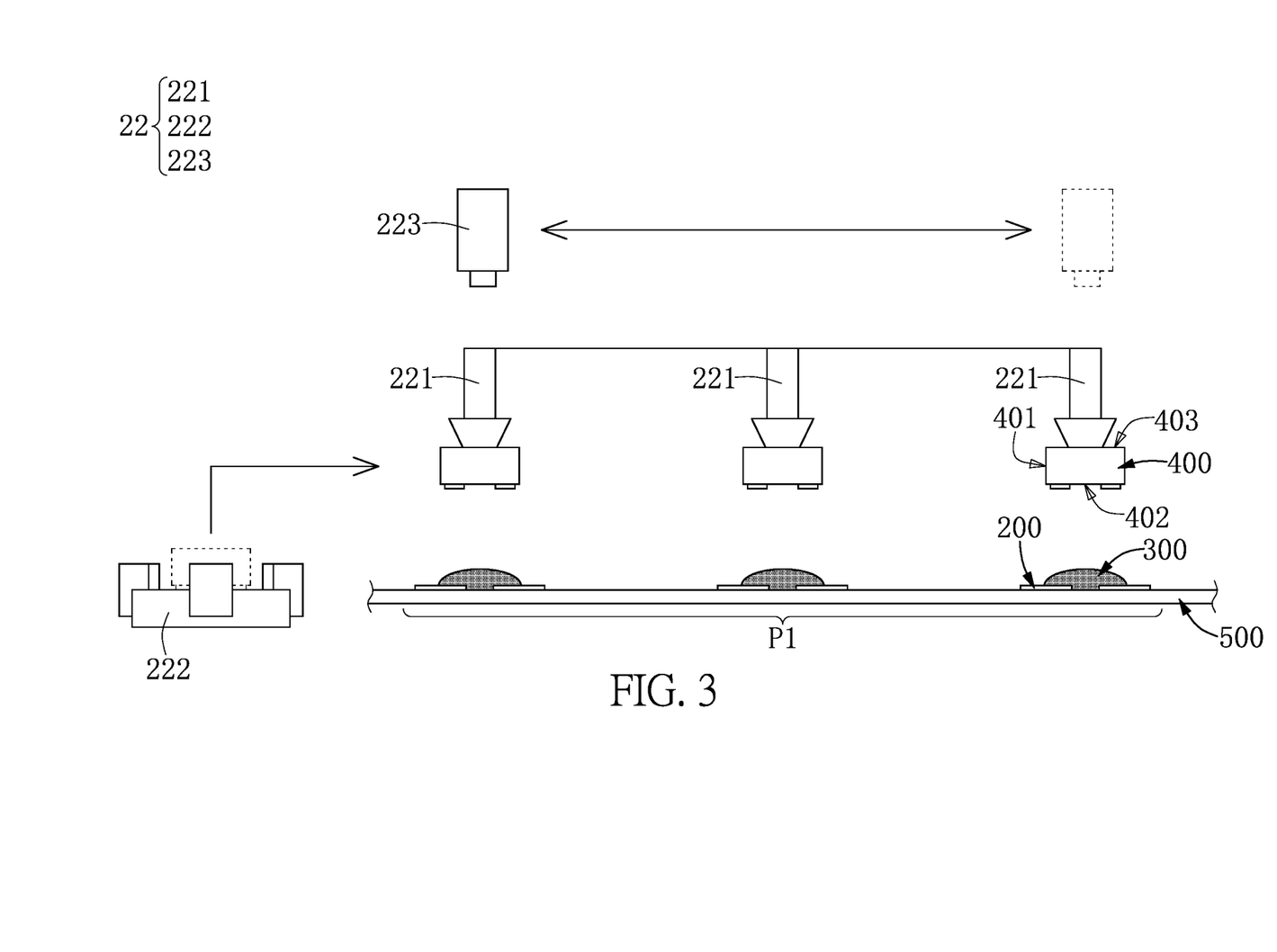
FIG. 3 is a schematic view showing a die-placing mechanism of the producing apparatus according to the first embodiment of the present disclosure.

As shown in FIG. 3, the die-placing mechanism 22 includes a plurality of catchers 221 configured to respectively hold the chips 400 (e.g., each of the catchers 221 can hold one of the chips 400), a correction unit 222 configured to adjust a relative position of the chips 400, and a camera 223 that is electrically coupled to the correction unit 222. The catcher 221 in the present embodiment is a vacuum extractor, and the catchers 221 can be arranged along a direction perpendicular to the predetermined path P, but the present disclosure is not limited thereto.

Moreover, the camera 223 in the present embodiment is arranged corresponding to the pre-bonding region P1 for detecting positions of the adhesives 300 moved through the pre-bonding region P1. The correction unit 222 is configured to adjust positions of the chips 400 held by the catchers 221 according to the positions of the adhesives 300 detected by the camera 223. The catchers 221 are configured to synchronously place the chips 400, adjusted by the correction unit 222, onto the adhesives 300 that are moved through the pre-bonding region P1.

In the present embodiment, the pre-bonding device 2 is provided for adjusting the relative position of the chips 400 through the correction unit 222, so that the chips 400 adjusted by the correction unit 222 can be synchronously disposed on the adhesives 300, respectively, by the catchers 221. Accordingly, the operation or producing efficiency of the producing apparatus 100 (or the pre-bonding device 2) can be effectively increased.

It should be noted that the die-placing mechanism 22 in the present embodiment includes the catchers 221, the correction unit 222, and the camera 223, which are used in cooperation with each other, but the present disclosure is not limited thereto. For example, in other embodiments of the present disclosure, the die-placing mechanism 22 can be provided without the correction unit 222 and/or the camera 223.

Specifically, the correction unit 222 can have different configurations when the above conditions are met. In order to clearly describe the correction unit 222 of the present embodiment, the drawings of the present embodiment (e.g., FIG. 4 to FIG. 6) only show three configurations (e.g., a first configuration, a second configuration, and a third configuration) of the correction unit 222, but the specific configuration of the correction unit 222 can be adjusted or changed according to design requirements and is not limited to the drawings of the present embodiment.

Figure 4:
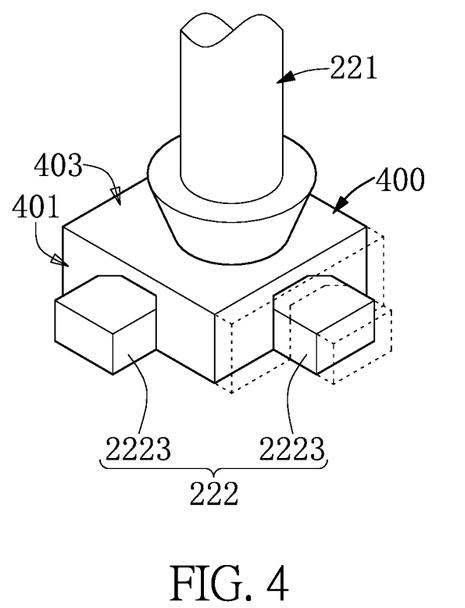
FIG. 4 is a schematic view showing a correction unit of the producing apparatus in a first configuration (or type I) according to the first embodiment of the present disclosure.

The first configuration (i.e., type I) of the correction unit 222 is shown in FIG. 4. The correction unit 222 includes a plurality of abutting arms 2223 in a ring-shaped arrangement, and the abutting arms 2223 are configured to abut against a surrounding lateral surface 401 (or lateral surfaces) of the chip 400 held by one of the catchers 221 so as to adjust the chip 400 held by the one of the catchers 221 to a specific position (as shown in the solid line of FIG. 4). In other words, the abutting arms 2223 can slightly push the chip 400 to change its position while the chip 400 remains being held by the corresponding catcher 221, thereby adjusting the chip 400 to the specific position. Moreover, the specific position corresponds to a position of the adhesive 300 upon which the chip 400 is desired to be disposed.

Figure 5:
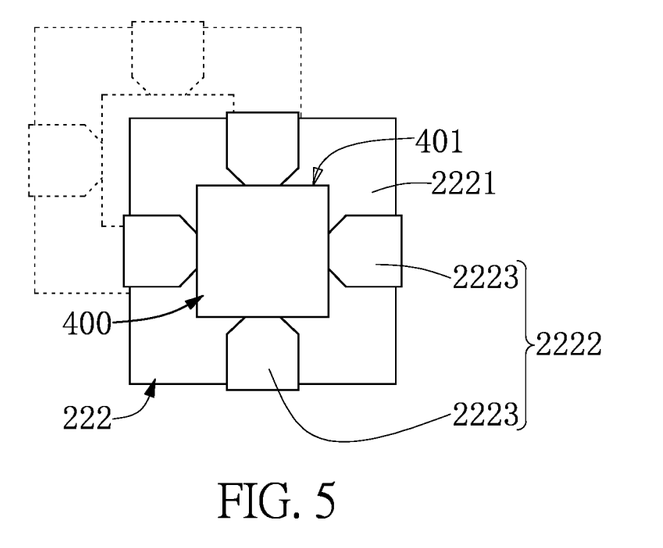
FIG. 5 is a schematic view showing the correction unit of the producing apparatus in a second configuration (or type II) according to the first embodiment of the present disclosure.
Figure 6:
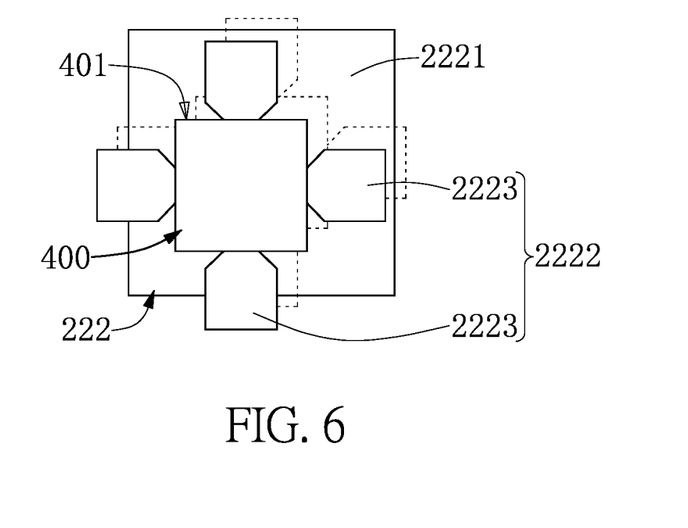
FIG. 6 is a schematic view showing the correction unit of the producing apparatus in a third configuration (or type III) according to the first embodiment of the present disclosure.

The second configuration (i.e., type II) and the third configuration (i.e., type III) of the correction unit 222 are shown in FIG. 5 and FIG. 6. The correction unit 222 includes a positioning plate 2221 configured to carry any one of the chips 400 and a fine-tuning member 2222 that is assembled to the positioning plate 2221. The fine-tuning member 2222 (and the positioning plate 2221) can be configured to adjust a position of the chip 400 located on the positioning plate 2221 according to the positions of the adhesives 300 detected by the camera 223.

Specifically, as shown in FIG. 5 (i.e., the second configuration of the correction unit 222), the fine-tuning member 2222 includes a plurality of abutting arms 2223 in a ring-shaped arrangement. The abutting arms 2223 are configured to synchronously abut against a surrounding lateral surface 401 of one of the chips 400 located on the positioning plate 2221, and the positioning plate 2221 and the abutting arms 2223 are configured to be synchronously moved so as to adjust the one of the chips 400 to a specific position (as shown in the solid line of FIG. 5). Moreover, the specific position corresponds to a position of the adhesive 300 that the chip 400 is desired to be disposed thereon.

In addition, as shown in FIG. 6 (i.e., the third configuration of the correction unit 222), the fine-tuning member 2222 includes a plurality of abutting arms 2223 in a ring-shaped arrangement. The abutting arms 2223 are configured to synchronously abut against a surrounding lateral surface 401 of one of the chips 400 located on the positioning plate 2221 so as to adjust the one of the chips 400 to a specific position (as shown in the solid line of FIG. 6). In other words, the abutting arms 2223 can be configured to move the chip 400 with respect to the positioning plate 2221 so as to adjust the chip 400 to the specific position. Moreover, the specific position corresponds to a position of the adhesive 300 upon which the chip 400 is desired to be disposed.

Figure 7:
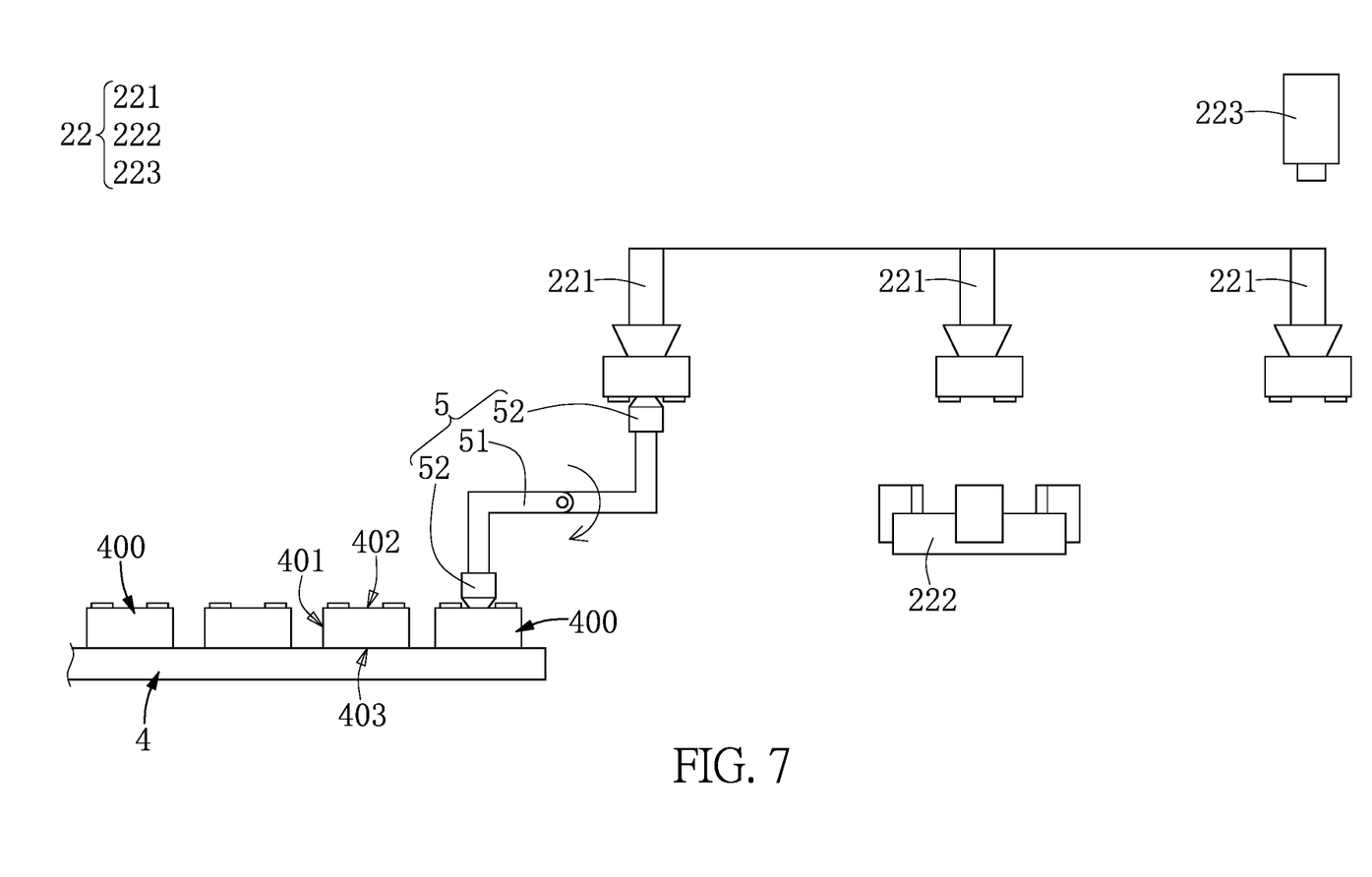
FIG. 7 is a schematic view showing the die-placing mechanism, a carrying tray, and an overturning device of the producing apparatus according to the first embodiment of the present disclosure.

As shown in FIG. 7, the producing apparatus 100 can further include a carrying tray 4 and an overturning device 5, which are arranged corresponding to the die-placing mechanism 22. The carrying tray 4 is configured to carry the chips 400. Each of the chips 400 has a soldering surface 402 and an outer surface 403, which are respectively arranged at two opposite sides of the surrounding lateral surface 401. When the chips 400 are disposed on the carrying tray 4, the soldering surface 402 of each of the chips 400 faces toward one side away from the carrying tray 4. In other words, the outer surface 403 of each of the chips 400 is disposed onto the carrying tray 4.

The overturning device 5 is configured to separate the chips 400 from the carrying tray 4 for providing each of the catchers 221 to hold one of the chips 400 (from the overturning device 5). The overturning device 5 is configured to overturn any one of the chips 400 separated from the carrying tray 400 so as to cause the soldering surface 402 to be rotated by 180 degrees to face toward the carrying tray 4 (i.e., the outer surface 403 of the chip 400 faces toward one of the catchers 221).

It should be noted that the overturning device 5 can have different configurations when the above conditions are met. In order to clearly describe the overturning device 5 of the present embodiment, the drawings of the present embodiment only show a preferable configuration of the overturning device 5, but the specific configuration of the overturning device 5 can be adjusted or changed according to design requirements and is not limited to the drawings of the present embodiment.

In the present embodiment, the overturning device 5 includes a rotating frame 51 and two end portions 52 (e.g., nozzles) that are assembled to the rotating frame 51. Any one of the two end portions 52 is configured to hold one of the chips 400 from the carrying tray 4 and to overturn the one of the chips 400 through rotation of the rotating frame 51, so that the one of the chips 400 is moved to be adjacent to one of the catchers 221. Specifically, when one of the chips 400 held by one of the two end portions 52 is located adjacent to one of the catchers 221, another one of the two end portions 52 is configured to hold another one of the chips 400 from the carrying tray 4.

Moreover, a distance between two of the catchers 221 adjacent to each other corresponds to (e.g., is substantially equal to) a distance between the overturning device 5 (e.g., the rotating frame 51) and the correction unit 222, so that when one of the chips 400 held by one of the two end portions 52 is located adjacent to one of the two of the catchers 221 adjacent to each other, another one of the two of the catchers 221 adjacent to each other (that holds another one of the chips 400 from the overturning device 5) corresponds in position to the correction unit 222.

Accordingly, since the distance between two of the catchers 221 adjacent to each other in the producing apparatus 100 corresponds to (e.g., is substantially equal to) the distance between the overturning device 5 (e.g., the rotating frame 51) and the correction unit 222, two of the catchers 221 adjacent to each other can be synchronously cooperated with the overturning device 5 and the correction unit 222 for effectively increasing the operation performance of the producing apparatus 100.

Figure 8:
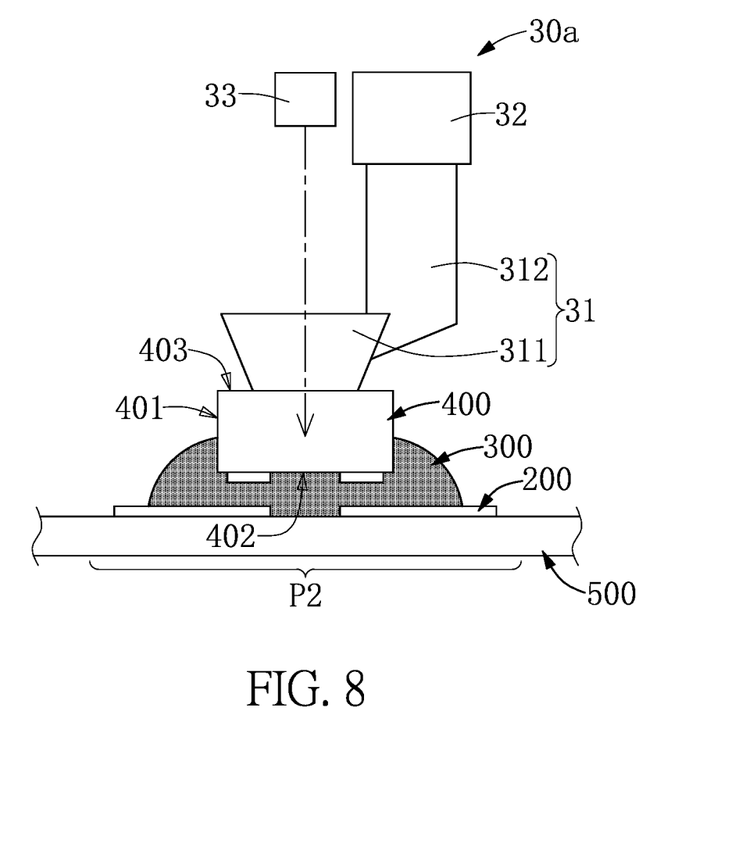
FIG. 8 is a schematic view showing a die-bonding arm of the producing apparatus according to the first embodiment of the present disclosure.

As shown in FIG. 1 and FIG. 8, the die-bonding device 3 is arranged corresponding to the die-bonding region P2 of the predetermined path P. The die-bonding device 3 is configured to press the chips 400 moving through the pre-bonding region P2 and is configured to solidify the adhesives 300 moving through the pre-bonding region P2, so that any one of the chips 400 can be connected to the corresponding carrier 200 through the corresponding adhesive 300. In the present embodiment, the die-bonding device 3 includes a plurality of die-bonding arms 30a. The die-bonding arms 30a are preferably arranged in rows that are respectively defined as a plurality of die-bonding arm assemblies, and each of the die-bonding assemblies has at least two of the die-bonding arms 30a and is arranged in a direction perpendicular to the predetermined path P.

As the die-bonding arms 30a in the present embodiment are of substantially the same structure and operation, the following description discloses the structure and operation of just one of the die-bonding arms 30a for the sake of brevity, but the present disclosure is not limited thereto. For example, in other embodiments of the present disclosure, the die-bonding arms 30a can be of different structures.

The die-bonding arms 30a includes a pressing frame 31, a force control unit 32 (e.g., a hydraulic cylinder or a pneumatic cylinder) connected to the pressing frame 31, and a light curing member 33 (e.g., a light emitter). The pressing frame 31 has a light-permeable portion 311 and an arm portion 312 that is connected to the light-permeable portion 311. In the present embodiment, the light-permeable portion 311 is transparent, the light curing member 33 is arranged corresponding to the light-permeable portion 311, and the force control unit 32 is assembled to the arm portion 312. The light curing member 33 can emit a curing light passing through the light-permeable portion 311 by being arranged corresponding to the light-permeable portion 311.

Specifically, the pressing frame 31 is movable to press one of the chips 400 moving through the die-bonding region P2, and the light-permeable portion 311 is configured to press the one of the chips 400. It should be noted that the pressing frame 31 in the present embodiment is configured to press the chip 400 through the light-permeable portion 311, but the present disclosure is not limited thereto. For example, in other embodiments of the present disclosure that are not shown in figures, the pressing frame 31 can press the chip 400 through a portion thereof that surrounds the light-permeable portion 311.

When any one of the die-bonding arms 30a presses one of the chips 400, the pressing frame 31 (e.g., the light-permeable portion 311) directly presses a part of the outer surface 403 of the one of the chips 400 (e.g., the pressing frame 31 abuts against a center part of the outer surface 403 of the one of the chips 400, and is not in contact with a peripheral part of the outer surface 403 of the one of the chips 400, thereby preventing the corresponding adhesive 300 from flowing to the pressing frame 31). Accordingly, no separation film need be disposed between the pressing frame 31 (e.g., the light-permeable portion 311) and the corresponding chip 400.

Moreover, when the pressing frame 31 presses one of the chips 400, the force control unit 32 is allowed to drive the pressing frame 31 to press the one of the chips 400 by a predetermined force, so that the one of the chips 400 is connected to the corresponding carrier 200 through the corresponding adhesive 300. At the same time, the light curing member 33 is configured to emit a curing light passing through the light-permeable portion 311 onto the one of the chips 400 so as to solidify the corresponding adhesive 300. Specifically, the force control unit 32 of the die-bonding arm 30a in the present embodiment can drive the pressing frame 31 to press the chip 400 by the predetermined force, so that the conductive adhesive is electrically coupled to the chip 400 and the antenna by being pressed.

Accordingly, the die-bonding device 3 in the present embodiment is provided for replacing a conventional solidifying manner (e.g., an adhesive is solidified by heating and increasing an environment temperature) by using any one of the pressing frames 31 to press the corresponding chip 400 and using the light curing member 33 to solidify the corresponding adhesive 300, so that the operation and producing efficiency of the producing apparatus 100 (or the die-bonding device 3) can be effectively increased.

Second Embodiment

Figure 9:
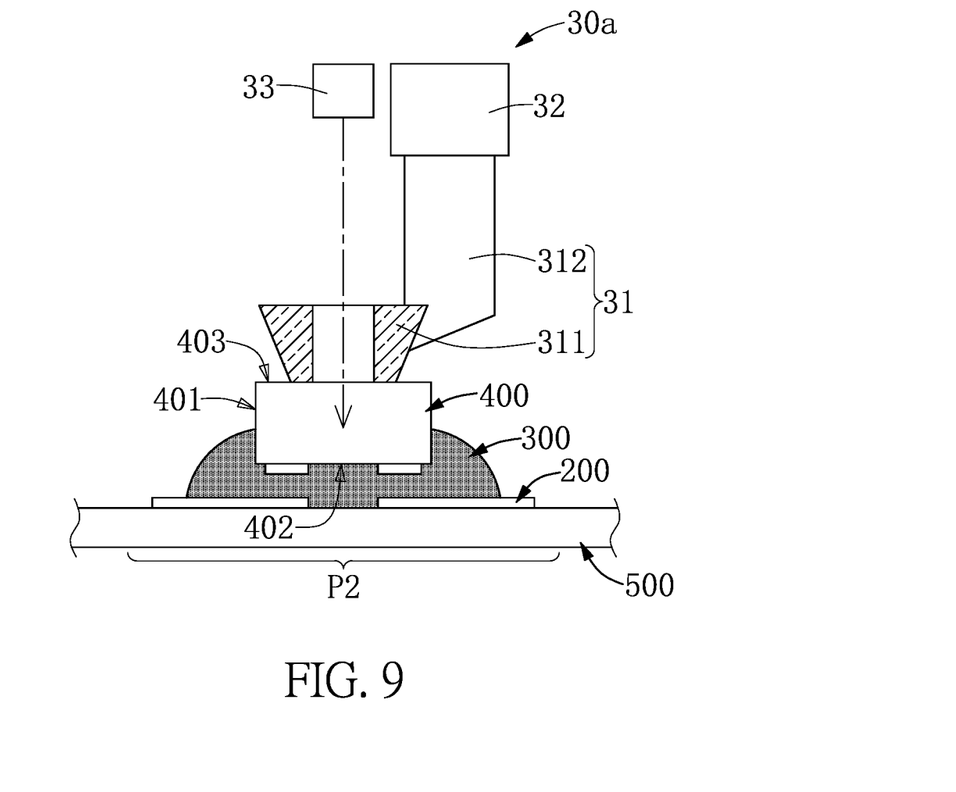
FIG. 9 is a schematic view showing a die-bonding arm of a producing apparatus according to a second embodiment of the present disclosure.

Referring to FIG. 9, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

In each of the die-bonding arms 30a of the present embodiment, the light-permeable portion 311 of the pressing frame 31 is in a hollow shape (i.e., the light-permeable portion 311 is a thru-hole), and the pressing frame 31 presses the chip 400 through a portion thereof that surrounds the light-permeable portion 311.

Third Embodiment

Figure 10:
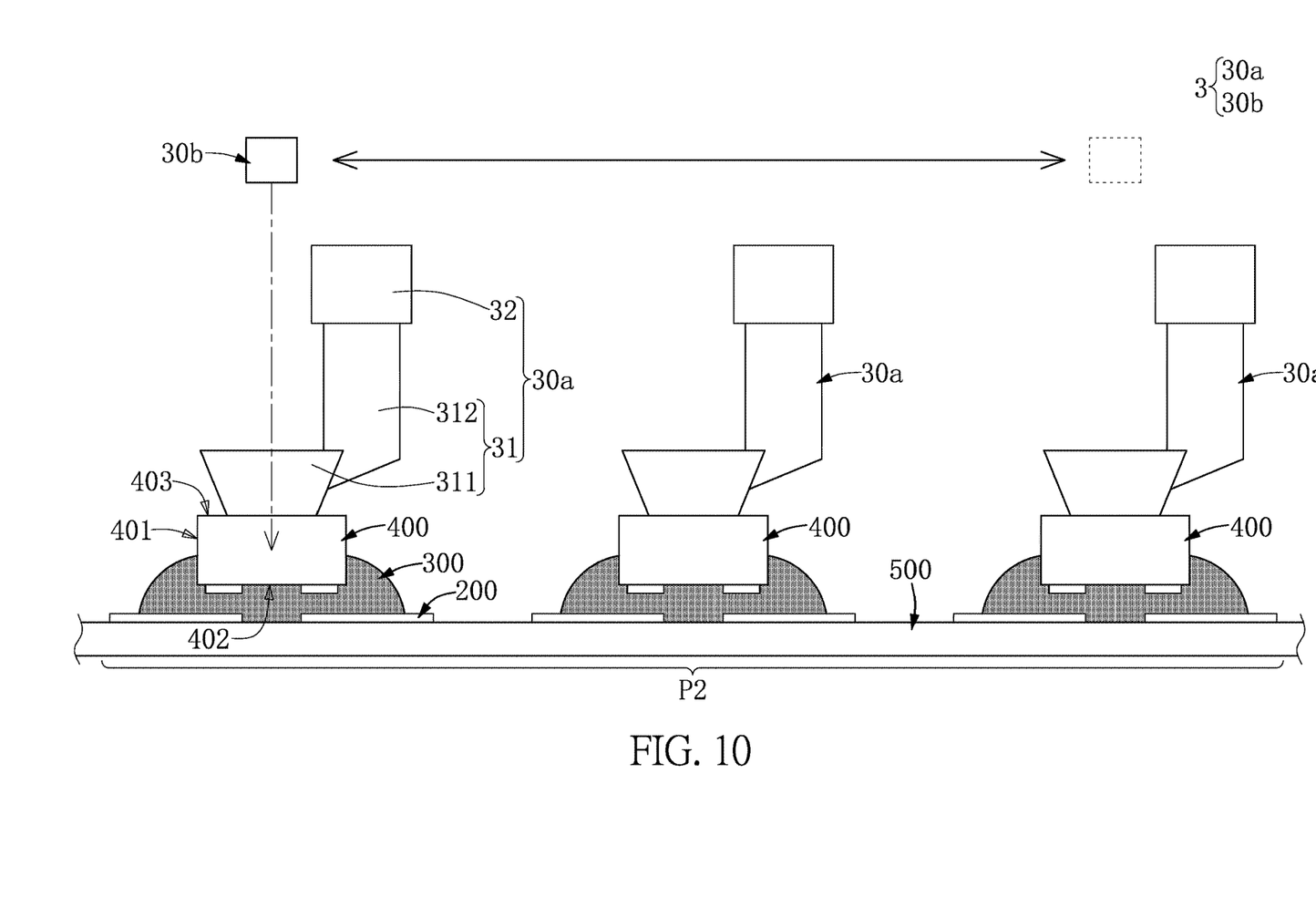
FIG. 10 is a schematic view showing a die-bonding device of a producing apparatus according to a third embodiment of the present disclosure.

Referring to FIG. 10, a third embodiment of the present disclosure is similar to the first and second embodiments of the present disclosure. For the sake of brevity, descriptions of the same components in the first to third embodiments of the present disclosure will be omitted herein, and the following description only discloses different features between the third embodiment and the first and second embodiments.

In the present embodiment, each of the die-bonding arms 30a does not have any light curing member 33, and the die-bonding device 3 includes a single light curing member 30b that is arranged corresponding to the light-permeable portions 311 of the die-bonding arms 30a. Accordingly, when the light-permeable portions 311 of each of the die-bonding arms 30a (e.g., each of the light-permeable portions 311) presses one of the chips 400 by the predetermined force, the light curing member 30b is configured to emit a curing light onto the corresponding chips 400 by passing through the light-permeable portions 311 one by one so as to solidify the corresponding adhesives 300.

Fourth Embodiment

Figure 11:
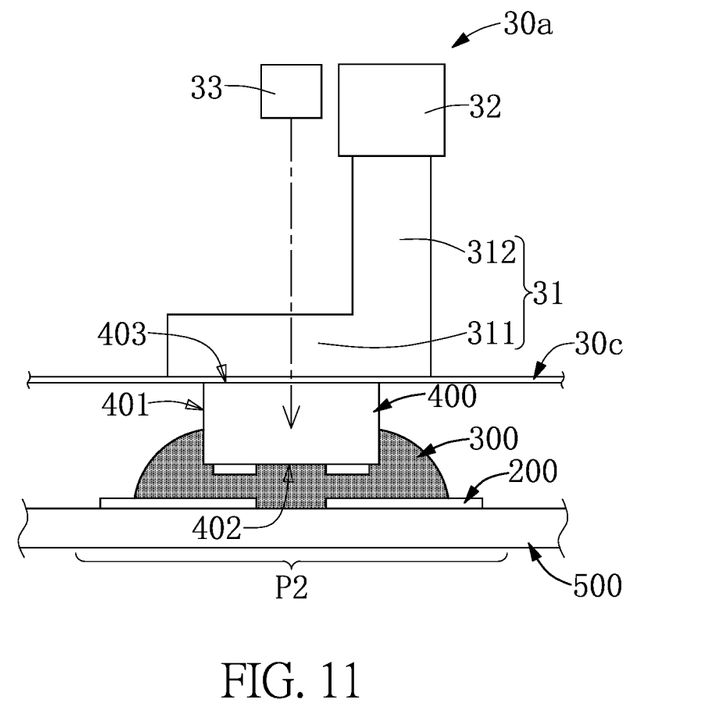
FIG. 11 is a schematic view showing a die-bonding arm of a producing apparatus according to a fourth embodiment of the present disclosure.

Referring to FIG. 11, a fourth embodiment of the present disclosure is similar to the first and second embodiments of the present disclosure. For the sake of brevity, descriptions of the same components in the first, second, and fourth embodiments of the present disclosure will be omitted herein, and the following description only discloses different features between the fourth embodiment and the first and second embodiments.

In the present embodiment, the die-bonding device 3 further includes a separation film 30c that is movable to be disposed between the die-bonding arms 30a and the corresponding chips 400. When any one of the die-bonding arms 30a presses one of the chips 400, the separation film 30c is sandwiched between the pressing frame 31 (e.g., the light-permeable portion 311) and the one of the chips 400, and the pressing frame 31 (e.g., the light-permeable portion 311) presses all of the outer surface 403 of the one of the chips 400 through the separation film 30c.

Accordingly, the die-bonding device 3 in the present embodiment is provided with the separation film 30c that does not affect any light curing process, thereby effectively preventing the light-permeable portion 311 of the pressing frame 31 from being polluted or adhered with the adhesive 300.

Fifth Embodiment

Figure 12:
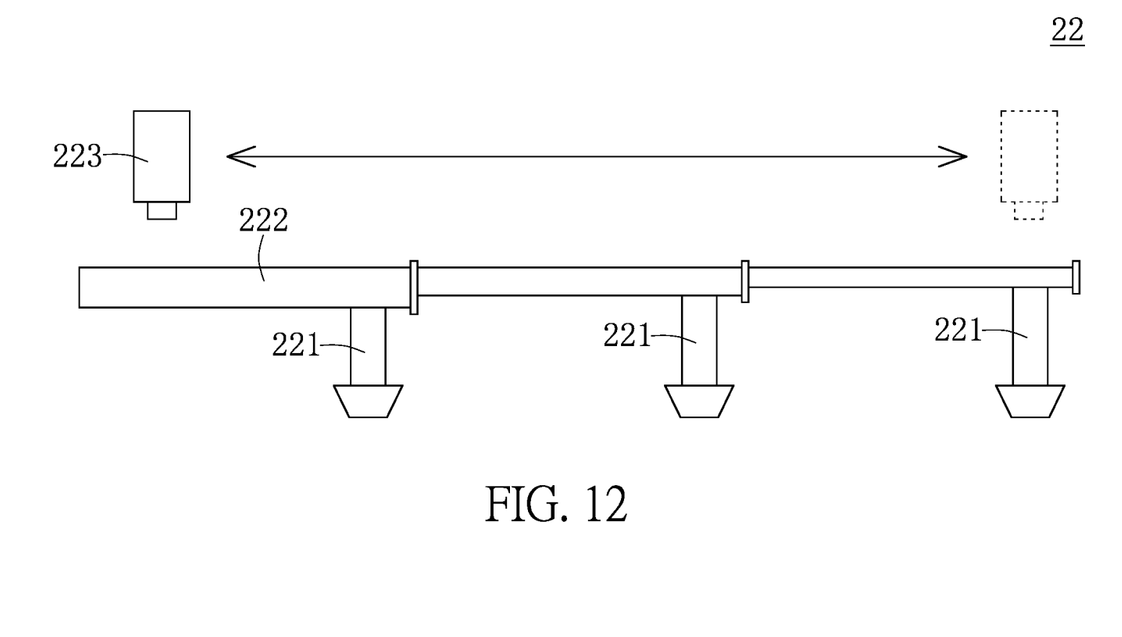
FIG. 12 is a schematic view showing a die-placing mechanism of a producing apparatus according to a fifth embodiment of the present disclosure.

Referring to FIG. 12, a fifth embodiment of the present disclosure is similar to the first to fourth embodiments of the present disclosure. For the sake of brevity, descriptions of the same components in the first to fifth embodiments of the present disclosure will be omitted herein, and the following description only discloses different features between the fifth embodiment and the first to fourth embodiments.

In the present embodiment, the correction unit 222 is a position-adjustment frame. The catchers 221 are assembled to the correction unit 222, the correction unit 222 is configured to adjust a relative position of the catchers 221, and the catchers 221 and the correction unit 222 are configured to be synchronously moved. Specifically, the correction unit 222 is configured to adjust the relative position of the catchers 221 each holding one of the chips 400 according to the positions of the adhesives 300 detected by the camera 223. In other words, the correction unit 222 in the present embodiment can control (or adjust) a relative position of the chips 400 by adjusting the relative position of the catchers 221.

Beneficial Effects of the Embodiments

In conclusion, the producing apparatus or the die-bonding device of the present disclosure is provided for replacing a conventional solidifying manner (e.g., an adhesive is solidified by heating and increasing an environment temperature) by using any one of the pressing frames to press the corresponding chip and using the light curing member to solidify the corresponding adhesive, so that the operation and producing efficiency of the producing apparatus (or the die-bonding device) can be effectively increased.

Moreover, the producing apparatus or the die-bonding device of the present disclosure is provided for adjusting the relative position of the chips through the correction unit, so that the chips adjusted by the correction unit can be synchronously disposed on the adhesives, respectively, by the catchers. Accordingly, the operation or producing efficiency of the producing apparatus (or the pre-bonding device) can be effectively increased.

Specifically, the pressing frame can directly press a part of the outer surface of the corresponding chip, thereby preventing the corresponding adhesive from flowing to the pressing frame. Accordingly, any separation film does not need to be disposed between the pressing frame and the corresponding chip.

In addition, since the distance between two of the catchers adjacent to each other in the producing apparatus corresponds to (e.g., is substantially equal to) the distance between the overturning device (e.g., the rotating frame) and the correction unit, two of the catchers adjacent to each other can be synchronously cooperated with the overturning device and the correction unit for effectively increasing the operation performance of the producing apparatus.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A producing apparatus, comprising:
   a transporting device defining a predetermined path, wherein the transporting device includes a plurality of carriers and an insulating film that is movable and that carries the plurality of carriers along the predetermined path, and wherein the predetermined path has a pre-bonding region and a die-bonding region that is located at a downstream position relative to the pre-bonding region;
   a pre-bonding device arranged corresponding to the pre-bonding region of the predetermined path and including:
      a dispenser configured to respectively form a plurality of adhesives onto the carriers that are moving through the pre-bonding region, wherein the carriers are separate from each other; and
      a die-placing mechanism disposed adjacent to the dispenser, wherein the die-placing mechanism includes a plurality of catchers configured to respectively hold a plurality of chips, a camera configured to detect positions of the adhesives moving through the pre-bonding region, and a correction unit that is configured to be operated when the catchers hold the chips for adjusting a relative position of the chips, wherein the camera is electrically coupled to the correction unit, the correction unit is configured to adjust positions of the chips held by the catchers according to the positions of the adhesives detected by the camera, and wherein the catchers are configured to synchronously place the chips adjusted by the correction unit onto the adhesives that are moving through the pre-bonding region, so that any one of the chips is able to be detached from the corresponding adhesive; and
   a die-bonding device arranged corresponding to the die-bonding region of the predetermined path, wherein the die-bonding device is configured to press against the chips moved through the pre-bonding region and is configured to solidify the adhesives moving through the pre-bonding region, so that any one of the chips is connected to and undetached from the corresponding carrier through the corresponding adhesive.

2. The producing apparatus according to claim 1, wherein the camera is arranged corresponding to the pre-bonding region.

3. The producing apparatus according to claim 2, wherein the correction unit includes a plurality of abutting arms in a ring-shaped arrangement, and wherein the abutting arms are configured to abut against a surrounding lateral surface of the chip held by one of the catchers so as to adjust the chip held by the one of the catchers to a specific position.

4. The producing apparatus according to claim 2, wherein the correction unit includes a positioning plate configured to carry any one of the chips and a fine-tuning member that is assembled to the positioning plate, and wherein the fine-tuning member is configured to adjust a position of the chip located on the positioning plate according to the positions of the adhesives detected by the camera.

5. The producing apparatus according to claim 4, wherein the correction unit includes a plurality of abutting arms in a ring-shaped arrangement, and wherein the abutting arms are configured to synchronously abut against a surrounding lateral surface of one of the chips located on the positioning plate, and the positioning plate and the abutting arms are configured to be synchronously moved so as to adjust the one of the chips to a specific position.

6. The producing apparatus according to claim 4, wherein the correction unit includes a plurality of abutting arms in a ring-shaped arrangement, and wherein the abutting arms are configured to synchronously abut against a surrounding lateral surface of one of the chips located on the positioning plate so as to adjust the one of the chips to a specific position.

7. The producing apparatus according to claim 2, wherein the die-bonding device includes a plurality of die-bonding arms each including:
   a pressing frame having a light-permeable portion, wherein the pressing frame is movable to press one of the chips moving through the die-bonding region;
   a force control unit connected to the pressing frame, wherein, when the pressing frame presses the one of the chips, the force control unit is allowed to drive the pressing frame to press the one of the chips by a predetermined force, so that the one of the chips is connected to the corresponding carrier through the corresponding adhesive; and
   a light curing member arranged corresponding to the light-permeable portion, wherein, when the pressing frame presses the one of the chips, the light curing member is configured to emit a curing light passing through the light-permeable portion onto the one of the chips so as to solidify the corresponding adhesive.

8. The producing apparatus according to claim 7, wherein the die-bonding device further includes a separation film that is movable to be disposed between the die-bonding arms and the chips, and wherein, when any one of the die-bonding arms presses one of the chips, the separation film is sandwiched between the pressing frame and the one of the chips, and the pressing frame presses, through the separation film, all of an outer surface of the one of the chips.

9. The producing apparatus according to claim 2, wherein the catchers are assembled to the correction unit, and the catchers and the correction unit are configured to be synchronously moved, and wherein the correction unit is configured to adjust a relative position of the catchers each holding one of the chips according to the positions of the adhesives detected by the camera.

10. The producing apparatus according to claim 1, further comprising:
    a carrying tray configured to carry the chips for allowing a soldering surface of each of the chips to face toward one side away from the carrying tray; and
    an overturning device configured to separate the chips from the carrying tray for providing each of the catchers to hold one of the chips, wherein the overturning device is configured to overturn any one of the chips separated from the carrying tray so as to cause the soldering surface to face toward the carrying tray.

11. The producing apparatus according to claim 10, wherein the overturning device includes a rotating frame and two end portions that are assembled to the rotating frame, wherein any one of the two end portions is configured to hold one of the chips from the carrying tray and to overturn the one of the chips through rotation of the rotating frame, so that the one of the chips is moved to be adjacent to one of the catchers, and wherein, when one of the chips held by one of the two end portions is located adjacent to one of the catchers, another one of the two end portions is configured to hold another one of the chips from the carrying tray.

12. The producing apparatus according to claim 11, wherein a distance between two of the catchers adjacent to each other corresponds to a distance between the overturning device and the correction unit, so that when one of the chips held by one of the two end portions is located adjacent to one of the two of the catchers adjacent to each other, another one of the two of the catchers adjacent to each other corresponds in position to the correction unit.

* * * * *